US007642172B2

United States Patent
Kim

(10) Patent No.: US 7,642,172 B2
(45) Date of Patent: Jan. 5, 2010

(54) METHOD OF FORMING ISOLATION LAYER IN SEMICONDUCTOR DEVICE

(75) Inventor: Dae-Kyeun Kim, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/326,903

(22) Filed: Dec. 3, 2008

(65) Prior Publication Data
US 2009/0140375 A1 Jun. 4, 2009

(30) Foreign Application Priority Data
Dec. 3, 2007 (KR) .................. 10-2007-0124442

(51) Int. Cl.
*H01L 21/76* (2006.01)

(52) U.S. Cl. ................. 438/424; 438/435; 257/E21.54; 257/E21.55

(58) Field of Classification Search ................ 438/424, 438/435; 257/E21.54, E21.55
See application file for complete search history.

(56) References Cited

U.S. PATENT DOCUMENTS

| 6,882,025 | B2* | 4/2005 | Yeo et al. ................. 257/510 |
| 7,052,964 | B2* | 5/2006 | Yeo et al. ................. 438/296 |
| 2006/0264003 | A1* | 11/2006 | Eun ............................ 438/424 |
| 2009/0203188 | A1* | 8/2009 | Shin et al. .................. 438/435 |

FOREIGN PATENT DOCUMENTS

| KR | 1020000039029 | 7/2000 |
| KR | 1020070073012 | 7/2007 |

* cited by examiner

*Primary Examiner*—David S Blum
(74) *Attorney, Agent, or Firm*—Sherr & Vaughn, PLLC

(57) ABSTRACT

A semiconductor device can include a semiconductor substrate, a first trench formed in the semiconductor substrate, a second trench formed in the semiconductor substrate, a first device isolation layer formed in the first trench, a second device isolation layer formed in the second trench having a different structure than the first device isolation layer.

11 Claims, 3 Drawing Sheets

METHOD OF FORMING ISOLATION LAYER IN SEMICONDUCTOR DEVICE

The present application claims priority under 35 U.S.C. §119 to Korean Patent Application No. 10-2007-0124442 (filed on Dec. 3, 2007), which is hereby incorporated by reference in its entirety.

BACKGROUND

In recent years, with large capacity and high integration of semiconductor devices, studies on memory cells based on a microfabricating technology in which an integration level doubles for each generation are actively in progress. As one of the technologies for implementing high integration of the semiconductor devices, a technology that reduces a device isolation layer for isolating a plurality of semiconductor devices on a wafer, thereby reducing the size of the semiconductor device, is attracting attention.

A shallow trench isolation (STI) process is a device isolation technology for reducing the size of the semiconductor device. In the STI process, trenches of a predetermined depth are formed in a semiconductor substrate, and an oxide film is deposited in the trenches by chemical vapor deposition (CVD). Then, an unnecessary oxide film is etched by chemical mechanical polishing (CMP), to thereby form a device isolation layer. A local oxidation of silicon (LOCOS) technology that selectively grows a thick oxide film on and/or over a semiconductor substrate to form a device isolation layer is used. However, there is a problem in that a device isolation region is decreased due to lateral diffusion of the device isolation layer and production of a bird's beak. The STI process is widely used for the sake of resolving this problem.

Figure 1A:
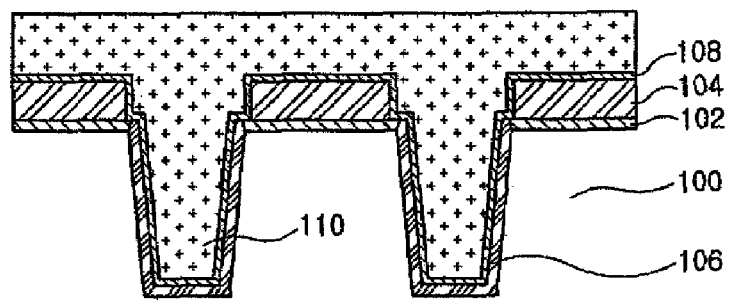

Referring to example FIG. 1A, an STI process for a semiconductor device may initially include sequentially forming pad oxide film 102 and a nitride film 104 on and/or over a semiconductor substrate 100. Next, photoresist is formed on and/or over the nitride film 104 and is patterned by photolithography and etching to correspond to portions of the semiconductor substrate 100 where trenches are to be formed for the STI process. Subsequently, the semiconductor substrate 100 is etched with the photoresist pattern as an etching mask. Thus, trenches for forming a device isolation layer are formed. Next, a thermal oxidation film 106 is formed on and/or over the surfaces of the trenches by oxidation, such as wet or dry etching. At this time, the thermal oxidation film 106 is formed to have a uniform thickness on and/or over the side surfaces and bottoms of the trenches. Next, a liner silicon nitride film 108 is deposited on and/or over the entire surface of the semiconductor substrate 100 including the trenches, and a dielectric filler 110 is deposited in the trenches by CVD. The dielectric filler 110 is a dielectric material that can completely fill the trenches. As the deposition process, for example, PE-CVD (Plasma Enhanced Chemical Vapor Deposition), HDP-CVD (High Density Plasma Chemical Vapor Deposition), or the like may be used.

Figure 1B:
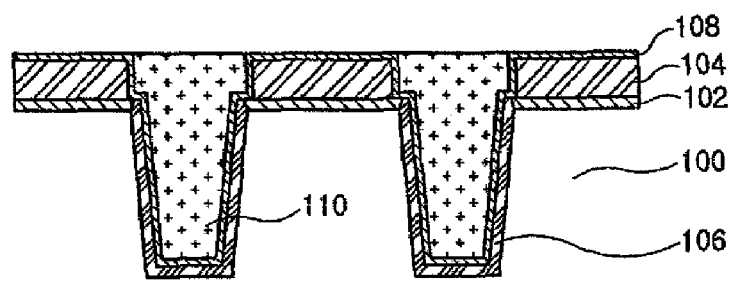

Next, as shown in example FIG. 1B, the dielectric filler 110 is planarly removed by CMP until the surface of the liner silicon nitride film 108 on the semiconductor substrate 100 where no trench is formed is exposed. Subsequently, the liner silicon nitride film 108, the nitride film 104, and the pad oxide film 102 are removed by etching.

Figure 1C:
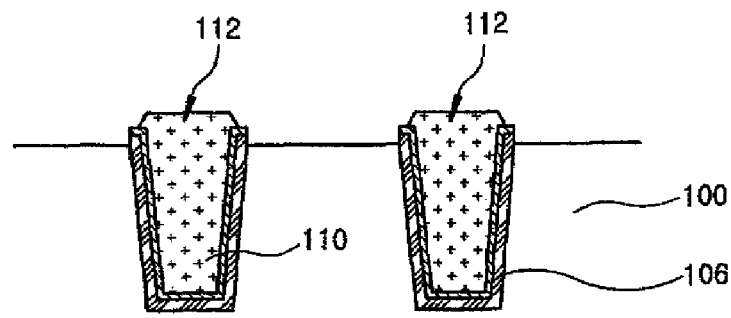

Thus, as shown in example FIG. 1C, a device isolation layer 112 filled with the dielectric filler 110 is formed in the semiconductor substrate 100. The liner silicon nitride film 108 controls stress inside of silicon, i.e., the semiconductor substrate 100, by suppressing an increase in stress due to an increase in volume of the trench when the thermal oxidation film is formed. The liner silicon nitride film 108 prevents doptants, such as boron (B) or the like, from being diffused or prevents $H_2O$ or the like from entering inside of the silicon.

According to the method of forming a device isolation layer in a semiconductor device, when stress in the silicon is tensile stress, electron mobility is increased, and NMOS performance is improved. Meanwhile, in a PMOS, when stress in the silicon is compressive stress, hole mobility is increased. From this viewpoint, when the same liner silicon nitride film is applied to the NMOS and PMOS in order to release STI stress, it is impossible to simultaneously improve the characteristics of the NMOS and PMOS. That is, it is necessary to differently apply a liner silicon nitride film to the NMOS and PMOS in order to release stress occurring when the thermal oxidation film is formed.

SUMMARY

Embodiments relate to a method of manufacturing a semiconductor device, and in particular, to a method of forming a device isolation layer in a semiconductor device which is suitable for simultaneously improving characteristics of NMOS and PMOS by differently applying a liner silicon nitride film which is used to suppress an influence of stress occurring when a device isolation layer is formed, to NMOS and PMOS.

Embodiments relate to a method of forming a device isolation layer in a semiconductor device which is capable of simultaneously improving the characteristics of NMOS and PMOS by differently applying a liner silicon nitride film, which is used to suppress an influence of stress occurring, to NMOS and PMOS during an STI process in manufacturing a semiconductor device.

Embodiments relate to a method of forming a device isolation layer in a semiconductor device which is capable of controlling the stress direction of NMOS or PMOS to a desired direction (tensile or compressive) by differently applying a liner silicon nitride film to NMOS and PMOS during an STI process in manufacturing a semiconductor device.

Embodiments relate to a method of forming a device isolation layer in a semiconductor device which is capable of controlling the stress direction of NMOS or PMOS to a desired direction (tensile or compressive) by forming a liner silicon nitride film as a multi-layered structure during an STI process in manufacturing a semiconductor device.

Embodiments relate to a method of forming a device isolation layer in a semiconductor that may include at least one of the following: forming trenches in a semiconductor substrate; forming an oxide film on and/or over the side surfaces and bottoms of the trenches by thermal oxidation; depositing a first liner silicon nitride film on and/or over the entire surface of the semiconductor substrate including the trenches; depositing an oxide film on and/or over the first liner silicon nitride film; and depositing a second liner silicon nitride film on and/or over the oxide film; removing the second liner silicon nitride film and the oxide film in prescribed trenches among the trenches by anisotropy etching and isotropy etching; depositing a dielectric filler on and/or over the entire surface of the semiconductor substrate including the trenches; removing the dielectric filler by chemical vapor deposition (CMP) until the surface of the first or second liner silicon nitride film on and/or over the semiconductor substrate where no trench is formed; and forming a first device isolation layer having multi-layered liner silicon nitride film in a trench and a second device isolation layer with the first liner silicon nitride film formed in a trench by etching.

Embodiments relate to a method that may include at least one of the following: forming trenches in a semiconductor substrate; forming an oxide film over the side surfaces and bottom surface of the trenches by thermal oxidation; depositing a first liner silicon nitride film over the entire surface of the semiconductor substrate including the trenches; sequentially depositing an oxide film on the first liner silicon nitride film and a second liner silicon nitride film on the oxide film; removing the second liner silicon nitride film and the oxide film in predetermined one of the trenches by anisotropy etching and isotropy etching; depositing a dielectric filler over the entire surface of the semiconductor substrate including the trenches; removing portions of the dielectric filler over the uppermost surface of the semiconductor substrate; and forming a first device isolation having a multi-layered liner silicon nitride film in first ones of the trenches and a second device isolation layer having the first liner silicon nitride film formed in other ones of the trenches by etching portions of the first liner silicon nitride film, the second liner silicon nitride film and the oxide film formed over the uppermost surface of the semiconductor substrate.

Embodiments relate to a method that may include at least one of the following: sequentially forming a first oxide film and a first nitride film over a semiconductor substrate; forming photoresist patterns exposing portions of the semiconductor substrate; forming trenches in the semiconductor substrate by etching the exposed portions of semiconductor substrate using the photoresist patterns as masks; forming a second oxide film over the surfaces of the trenches; forming a second nitride film over the thermal oxidation film and the first nitride film; forming a third oxide film over the second nitride film; forming a third nitride film over the third oxide film; removing the third nitride film and the third oxide film in predetermined ones of the trenches; forming a dielectric film over the entire surface of the semiconductor substrate and filling the trenches; removing portions of the dielectric film exposing the second nitride film in the predetermined trenches and the third nitride film in remaining ones of the trenches; simultaneously forming a first device isolation layer and a second device isolation layer having different structures in the trenches by removing the first, second and third nitride films, and the first oxide film from the uppermost surface of the semiconductor substrate.

Embodiments relate to an apparatus that may include at least one of the following: a semiconductor substrate; a first trench formed in the semiconductor substrate; a second trench formed in the semiconductor substrate; a first device isolation layer formed in the first trench; a second device isolation layer formed in the second trench having a different structure than the first device isolation layer.

In accordance with embodiments, a device isolation layer having a multi-layered liner silicon nitride film is formed in a semiconductor device. Therefore, the stress direction of an NMOS or a PMOS can be controlled to a desired direction (tensile or compressive). As a result, device performance can be maximized. In particular, since the multi-layered liner silicon nitride film is used, by controlling the thickness of the liner silicon nitride film, stress in the NMOS and PMOS can be controlled minutely.

DRAWINGS

Example FIGS. 1A to 1C are process views showing an STI process for a semiconductor device.

Example FIGS. 2A to 2F are process views showing an STI process for a semiconductor device in accordance with embodiments.

DESCRIPTION

In accordance with embodiments, during an STI process in manufacturing a semiconductor device, a liner silicon nitride film is applied having different structures in an NMOS and a PMOS, such that the stress direction of the NMOS or PMOS is controlled to a desired direction such as a compressive stress direction or a tensile stress direction. In accordance with embodiments, during the STI process, a liner silicon nitride film is deposited in multiple layers to form an STI layer.

Figure 2A:
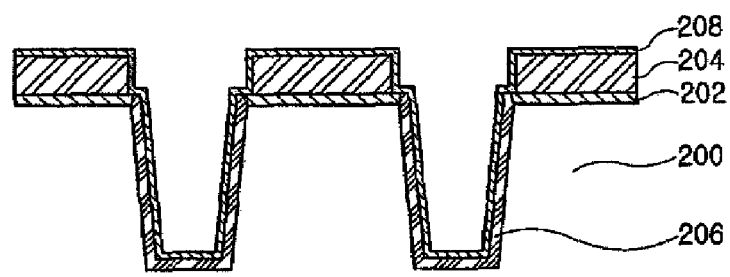

Referring to example FIG. 2A, in order to form a device isolation layer, a pad oxide film 202 and a nitride film 204 are sequentially deposited on and/or over the semiconductor substrate 200. Next, photoresist is formed on and/or over the nitride film 204 and is patterned by photolithography and etching to expose portions of the semiconductor substrate 200 where trenches are to be formed for the STI process. Subsequently, the semiconductor substrate 200 is etched with the photoresist pattern as an etching mask to thereby form trenches for forming a device isolation layer. Next, a thermal oxidation film 206 is formed on and/or over the surfaces of the trenches by oxidation, such as wet or dry etching. The thermal oxidation film 206 is formed having a uniform thickness on and/or over the side surfaces and bottoms of the trenches.

Figure 2B:
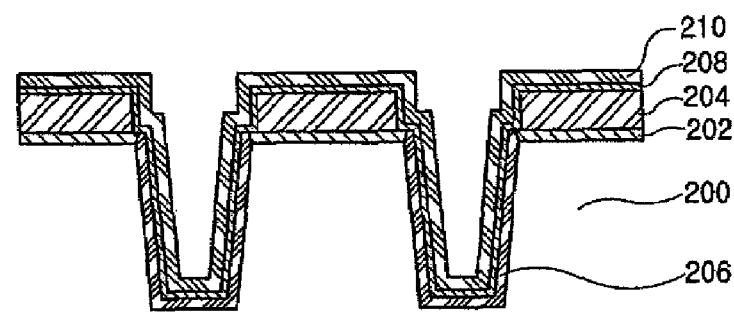
Figure 2C:
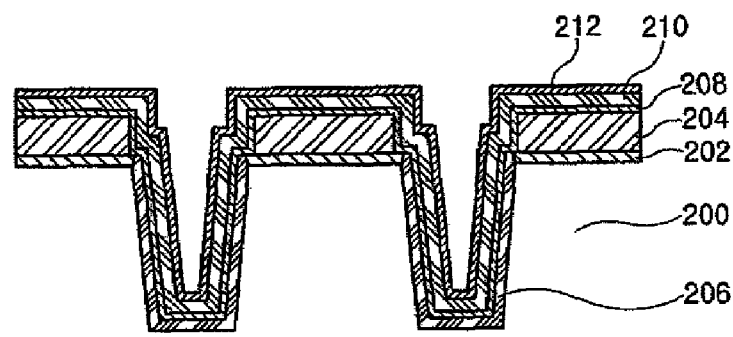

Referring to example FIG. 2B, a first liner silicon nitride film 208 is then deposited on and/or over the entire surface of the semiconductor substrate 200 including the trenches. An oxide film 210 is then deposited on and/or over the first nitride silicon nitride liner film 208. Referring to example FIG. 2C, a second liner silicon nitride film 212 is then deposited on and/or over the oxide film 210. The reason why a two-layered liner silicon nitride film is deposited is that the second liner silicon nitride film 212 can be easily selectively removed such that an existing structure and a two-layered structure of the first and second liner silicon nitride films 208, 212 are implemented. With this structure, according to whether a device to be manufactured is an NMOS or a PMOS, a corresponding structure can be selectively implemented.

Figure 2D:
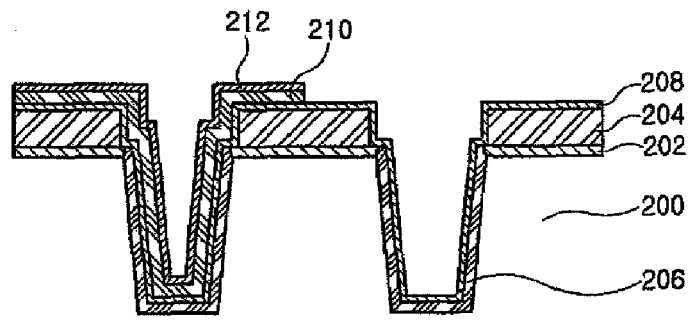
Figure 2E:
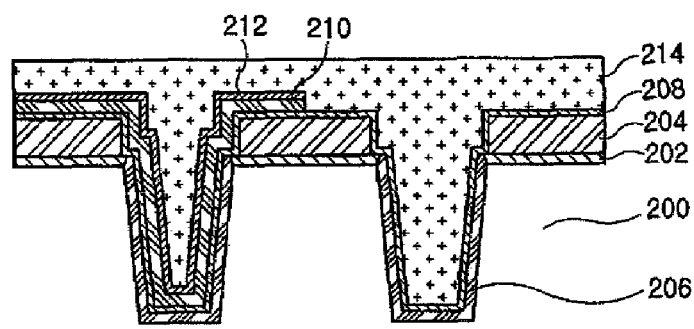

Next, as shown in FIG. 2D, a specific region among the NMOS and PMOS regions is patterned by photolithography and etching, and the second liner silicon nitride film 212 and the oxide film 210 in the exposed trench are etched. Next, as shown in FIG. 2E, a dielectric filler 214 is deposited on and/or over the entire surface of the semiconductor substrate 200 including filling the trenches by CVD, such as PE-CVD or HDP-CVD. The dielectric filler 220 is a dielectric material that can completely fill the trench, and may be made of a USG (Undoped Silicate Glass) film or an oxide film. Next, the dielectric filler 214 is planarly removed by CMP until the surface of the first liner silicon nitride film 208 or the second liner silicon nitride film 212 on the semiconductor substrate 200 where no trench is formed is exposed. Subsequently, the second liner silicon nitride film 212, the first liner silicon nitride film 208, the nitride film 204, and the pad oxide film 202 are removed from the surface of the semiconductor substrate 200 by etching.

Figure 2F:
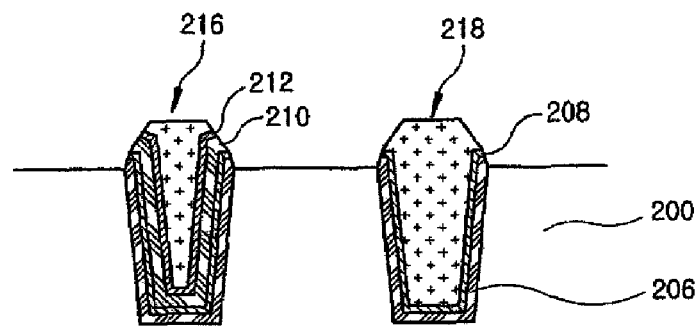

Thus, as shown in FIG. 2F, a first device isolation layer 216 with the multi-layered liner silicon nitride film 208, 212 formed in a trench and a second device isolation layer 218 with the first liner silicon nitride film 208 formed in a trench are formed in the semiconductor substrate 200. According to whether a device to be manufactured is an NMOS transistor or a PMOS transistor, the device isolation layer 218 having good tensile stress and the device isolation layer 216 having good compressive stress can be selectively formed. Since the multi-layered structure of the first liner silicon nitride film 208 and the second liner silicon nitride film 212 is deposited, if necessary, the second liner silicon nitride film 212 in the trench can be easily selectively removed. Therefore, the thicknesses of the nitride films 208 and 212 can be controlled, and as a result, stress in the NMOS and PMOS can be controlled minutely.

As described above, according in accordance with embodiments, during the STI process in manufacturing a semiconductor device, a liner silicon nitride film is differently applied to the NMOS and PMOS. Therefore, the stress direction of the NMOS or PMOS can be controlled to a desired stress direction, that is, a compressive stress direction or a tensile stress direction.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    forming trenches in a semiconductor substrate;
    forming an oxide film over the side surfaces and bottom surface of the trenches by thermal oxidation;
    depositing a first liner silicon nitride film over the entire surface of the semiconductor substrate including the trenches;
    sequentially depositing an oxide film on the first liner silicon nitride film and a second liner silicon nitride film on the oxide film;
    removing the second liner silicon nitride film and the oxide film in predetermined one of the trenches by anisotropy etching and isotropy etching;
    depositing a dielectric filler over the entire surface of the semiconductor substrate including the trenches;
    removing portions of the dielectric filler over the uppermost surface of the semiconductor substrate; and
    forming a first device isolation having a multi-layered liner silicon nitride film in first ones of the trenches and a second device isolation layer having the first liner silicon nitride film formed in other ones of the trenches by etching portions of the first liner silicon nitride film, the second liner silicon nitride film and the oxide film formed over the uppermost surface of the semiconductor substrate.

2. The method of claim 1, wherein forming the trenches comprises:
    depositing a pad oxide film and a nitride film over the semiconductor substrate;
    patterning the pad oxide film and the nitride film to expose portions of the semiconductor substrate; and
    etching the exposed portions of the semiconductor substrate to a predetermined depth to form the trenches.

3. The method of claim 1, wherein the first device isolation layer and the second device isolation layer are selectively applied whether a device to be manufactured is an NMOS transistor or a PMOS transistor.

4. The method of claim 3, wherein a specific region among the NMOS and PMOS regions is patterned by photolithography and etching.

5. The method of claim 1, wherein removing the second liner silicon nitride film and the oxide film is performed by anisotropy etching and isotropy etching.

6. The method of claim 1, wherein removing portions of the dielectric filler is performed by chemical vapor deposition (CMP).

7. A method comprising:
    sequentially forming a first oxide film and a first nitride film over a semiconductor substrate;
    forming photoresist patterns exposing portions of the semiconductor substrate;
    forming trenches in the semiconductor substrate by etching the exposed portions of semiconductor substrate using the photoresist patterns as masks;
    forming a second oxide film over the surfaces of the trenches;
    forming a second nitride film over the thermal oxidation film and the first nitride film;
    forming a third oxide film over the second nitride film;
    forming a third nitride film over the third oxide film;
    removing the third nitride film and the third oxide film in predetermined ones of the trenches;
    forming a dielectric film over the entire surface of the semiconductor substrate and filling the trenches;
    removing portions of the dielectric film exposing the second nitride film in the predetermined trenches and the third nitride film in remaining ones of the trenches;
    simultaneously forming a first device isolation layer and a second device isolation layer having different structures in the trenches by removing the first, second and third nitride films, and the first oxide film from the uppermost surface of the semiconductor substrate.

8. The method of claim 7, wherein the second oxide film comprises a thermal oxidation film.

9. The method of claim 7, wherein the second and third nitride films comprise silicon nitride films.

10. The method of claim 7, wherein removing the third nitride film and the third oxide film is performed by anisotropy etching and isotropy etching.

11. The method of claim 7, wherein removing portions of the dielectric film is performed by chemical vapor deposition (CMP).

* * * * *